US007041575B2

(12) United States Patent
Forbes

(10) Patent No.: US 7,041,575 B2
(45) Date of Patent: May 9, 2006

(54) LOCALIZED STRAINED SEMICONDUCTOR ON INSULATOR

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/425,797

(22) Filed: Apr. 29, 2003

(65) Prior Publication Data

US 2004/0217391 A1    Nov. 4, 2004

(51) Int. Cl.
  *H01L 21/76* (2006.01)
  *H01L 21/425* (2006.01)
(52) U.S. Cl. .................. 438/450; 438/425; 438/528
(58) Field of Classification Search ........... 438/407, 438/423, 425, 439, 450, 526, 528
  See application file for complete search history.

(56) References Cited

U.S. PATENT DOCUMENTS

| | | | |
|---|---|---|---|
| 4,241,359 A | 12/1980 | Izumi et al. ............... 257/386 |
| 4,523,975 A | 6/1985 | Groves et al. | |
| 4,962,051 A | 10/1990 | Liaw | |
| 5,098,852 A | 3/1992 | Niki et al. | |
| 5,461,243 A | 10/1995 | Ek et al. .................... 257/190 |
| 5,482,869 A | 1/1996 | Kohyama | |
| 5,661,044 A | 8/1997 | Holland et al. ............ 438/766 |
| 5,673,223 A | 9/1997 | Park | |
| 5,691,230 A | 11/1997 | Forbes ......................... 437/62 |
| 5,759,898 A | 6/1998 | Ek et al. ..................... 438/291 |
| 5,854,501 A | 12/1998 | Kao | |
| 5,879,996 A | 3/1999 | Forbes ......................... 438/289 |
| 5,963,817 A | 10/1999 | Chu et al. ................... 438/410 |
| 5,991,225 A | 11/1999 | Forbes et al. | |
| 6,093,623 A | 7/2000 | Forbes ......................... 438/455 |
| 6,136,666 A | 10/2000 | So .............................. 438/458 |
| 6,162,657 A | 12/2000 | Schiele et al. | |
| 6,174,784 B1 | 1/2001 | Forbes ....................... 438/405 |
| 6,180,487 B1* | 1/2001 | Lin ............................ 438/407 |
| 6,204,145 B1 | 3/2001 | Noble ........................ 438/412 |
| 6,228,694 B1* | 5/2001 | Doyle et al. ................ 438/199 |
| 6,251,751 B1 | 6/2001 | Chu et al. | |
| 6,261,876 B1* | 7/2001 | Crowder et al. ............ 438/149 |
| 6,309,950 B1 | 10/2001 | Forbes ....................... 438/455 |
| 6,368,938 B1 | 4/2002 | Usenko ...................... 438/407 |
| 6,377,070 B1 | 4/2002 | Forbes ........................ 326/41 |

(Continued)

FOREIGN PATENT DOCUMENTS

JP  54-152464 A  11/1979

(Continued)

OTHER PUBLICATIONS

"Cornell Demonstrates a Universal Substrate", *Compound Semiconductor*, 3(2), (Mar./Apr. 1997),27-29.

(Continued)

*Primary Examiner*—Amir Zarabian
*Assistant Examiner*—Pamela E Perkins

(57) ABSTRACT

One aspect of this disclosure relates to a method for straining a transistor body region. In various embodiments, oxygen ions are implanted to a predetermined depth in a localized region of a semiconductor substrate, and the substrate is annealed. Oxide growth within the semiconductor substrate forms a local oxide region within the semiconductor substrate. A portion of the substrate forms a semiconductor layer over the local oxide region. In various embodiments, the semiconductor layer is an ultra-thin semiconductor layer having a thickness of approximately 300 Å or less. The oxide growth strains the semiconductor layer. An active region, including the body region, of the transistor is formed in the strained semiconductor layer. Other aspects are provided herein.

46 Claims, 9 Drawing Sheets

U.S. PATENT DOCUMENTS

| | | | |
|---|---|---|---|
| 6,424,001 B1 | 7/2002 | Forbes et al. | 257/315 |
| 6,448,601 B1 | 9/2002 | Forbes et al. | 257/302 |
| 6,455,397 B1 | 9/2002 | Belford | |
| 6,461,933 B1* | 10/2002 | Houston | 438/423 |
| 6,486,008 B1 | 11/2002 | Lee | |
| 6,496,034 B1 | 12/2002 | Forbes et al. | 326/41 |
| 6,514,836 B1 | 2/2003 | Belford | |
| 6,515,335 B1 | 2/2003 | Christiansen et al. | 257/347 |
| 6,531,727 B1 | 3/2003 | Forbes et al. | 257/302 |
| 6,538,330 B1 | 3/2003 | Forbes | 257/777 |
| 6,541,356 B1* | 4/2003 | Fogel et al. | 438/480 |
| 6,559,491 B1 | 5/2003 | Forbes et al. | 257/296 |
| 6,566,682 B1 | 5/2003 | Forbes | 257/51 |
| 6,583,437 B1* | 6/2003 | Mizuno et al. | 257/19 |
| 6,593,625 B1 | 7/2003 | Christiansen et al. | 257/347 |
| 6,597,203 B1 | 7/2003 | Forbes | 326/98 |
| 6,649,476 B1 | 11/2003 | Forbes | 438/268 |
| 6,649,492 B1 | 11/2003 | Chu et al. | 438/478 |
| 6,656,822 B1 | 12/2003 | Doyle et al. | |
| 6,689,671 B1 | 2/2004 | Yu et al. | |
| 6,703,293 B1 | 3/2004 | Tweet et al. | 438/518 |
| 6,703,648 B1 | 3/2004 | Xiang et al. | 257/192 |
| 6,717,216 B1 | 4/2004 | Doris et al. | |
| 6,740,913 B1 | 5/2004 | Doyle et al. | |
| 6,812,508 B1 | 11/2004 | Fukumi | |
| 6,825,102 B1 | 11/2004 | Bedell et al. | |
| 2002/0001965 A1 | 1/2002 | Forbes | 438/734 |
| 2003/0227072 A1 | 12/2003 | Forbes | 257/616 |
| 2004/0171196 A1 | 9/2004 | Walitzki | |
| 2004/0173798 A1 | 9/2004 | Forbes | |
| 2004/0214366 A1 | 10/2004 | Segal et al. | |
| 2004/0217352 A1 | 11/2004 | Forbes | |
| 2004/0224480 A1 | 11/2004 | Forbes | |
| 2004/0232422 A1 | 11/2004 | Forbes | |
| 2004/0232487 A1 | 11/2004 | Forbes | |
| 2004/0232488 A1 | 11/2004 | Forbes | |
| 2004/0235264 A1 | 11/2004 | Forbes | |
| 2005/0017273 A1 | 1/2005 | Forbes et al. | |
| 2005/0020094 A1 | 1/2005 | Forbes et al. | |
| 2005/0023529 A1 | 2/2005 | Forbes | |
| 2005/0023612 A1 | 2/2005 | Forbes | |
| 2005/0029619 A1 | 2/2005 | Forbes | |
| 2005/0032296 A1 | 2/2005 | Forbes | |
| 2005/0087842 A1 | 4/2005 | Forbes | |

FOREIGN PATENT DOCUMENTS

| | | |
|---|---|---|
| JP | 54-155770 A | 12/1979 |

OTHER PUBLICATIONS

Auberton-Herve, A J., "SOI: Materials to Systems", *Digest of the International Electron Device Meeting*, (1996), 1.1.1-1.1.8.

Autumn, Kellar , et al., "Adhesive force of a single gecko foot-hair", *Nature*, 405(6787), (Jun. 2000),681-685.

Autumn, Kellar , et al., "Evidence for van der Waals adhesion in gecko setae.", *Proceedings of the National Academy of Science U S A.*: 99(19), (Sep. 17, 2002),12252-6.

Belford, Rona E., et al., "Performance-Augmented CMOS Using Back-End Uniaxial Strain", *IEEE Device Research Conference*, (2002),41-42.

Biever, Celeste , "Secret of 'strained silicon' revealed: behind closed doors, Intel has perfected a novel way to improve chip performance.", *New Scientist*, 180(i2426-2428), (Dec. 20, 2003),27.

Brown, Chappell , "Bonding twist hints at universal substrate", *EETimes*, (1997),2 pages.

Bruel, M , et al., "Smart-Cut: a new silicon on insulator material technology based on hydrogen implantation and wafer bonding", *Japanese Journal of Applied Physics, Part 1 (Regular Papers, Short Notes & Review Papers)*, 36(3B), (1997), 1636-1641.

Chen, Xiangdong , et al., "Vertical P-MOSFETs with heterojunction between source/drain and channel", *IEEE Device Research Conference*, (2000),25-26.

Clark, Don , et al., "Intel unveils tiny new transistors: Process handles circuits 1/2000th the width of a human hair", *The Wall Street Journal*, (Aug. 13, 2002),3 pages.

Clifton, P A., et al., "A process for strained silicon n-channel HMOSFETs", *ESSDERC'96, Proceedings of the 26th European Solid State Device Research Conference*, (Sep. 1996),519-22.

Fischetti, M V., et al., "Band structure, deformation potentials, and carrier mobility in strained Si, Ge, and SiGe alloys", *Journal of Applied Physics*, 80(4), (Aug. 15, 1996), 2234-2252.

Fournel, F , et al., "Ultra High Precision Of The Tilt/Twist Misorientation Angles In Silicon/Silicon Direct Wafer Bonding", *Abstract—Electronic Materials Conference*, (Jun. 2002),9.

Iyer, S S., "Separation by Plasma Implantation of Oxygen (SPIMOX) operational phase space" , *IEEE trans. on Plasma Science*, 25, (1997),1128-1135.

Kalavade, Pranav , et al., "A novel sub-10 nm transistor", *58th DRC. Device Research Conference. Conference Digest*, (Jun. 19-21, 2000),71-72.

Loo, Y L., et al., "Contact Printing With Nanometer Resolution", *Device Research Conference*, (Jun. 2002),149-150.

Mizuno, T , et al., "Advanced SOI-MOSFETs with Strained-Si Channel for High Speed CMOS Electron/Hole Mobility Enhancement", *2000 Symposium on VLSI Technology. Digest of Technical Papers.* (2000),210-211.

O'Neill, A G., et al., "High speed deep sub-micron MOSFET using high mobility strained silicon channel", *ESSDERC '95. Proceedings of the 25th European Solid State Device Research Conference*, (Sep. 995),109-12.

Omi, Hiroo , et al., "Semiconductor Surface with Strain Control", http://www.brl.ntt.co.jp/J/kouhou/katsudou/report00/E/report04_e.html.

Ouyang, Q , et al., "Bandgap Engineering in Deep Submicron Vertical pMOSFETs", *IEEE Device Research Conference*, (2000),27-28.

People, R. , "Calculation of critical layer thickness versus lattice mismatch for GexSi1-x/Si strained-layer heterostructures", *Applied Physics Letters*, 47(3), (Aug. 1, 1985),322-4.

Rim, Kern , et al., "Fabrication and analysis of deep submicron strained-Si n-MOSFET's", *IEEE Transactions on Electron Devices*, 47(7), (Jul. 2000),1406-1415.

Rim, Kern , et al., "Strained Si NMOSFETs for High Performance CMOS Technology", *2001 Symposium on VLSI Technology. Digest of Technical Papers*, (2001),59-60.

Rim, Kern , et al., "Transconductance enhancement in deep submicron strained Si n-MOSFETs", *International Electron Devices Meeting 1998. Technical Digest*, (1998),707-710.

Sugiyama, N , et al., "Formation of strained-silicon layer on thin relaxed-SiGe/SiO/sub 2//Si structure using SIMOX technology", *Thin Solid Films*, 369(1-2), (Jul. 2000),199-202.

Takagi, Shin-ichi , "Strained-Si- and SiGe-On-Insulator (Strained-SOI and SGOI) MOSFETs for High Performance/Low Power CMOS Application", *Device Research Confer-* ence, 2002. 60th DRC. Conference Digest, IEEE, (2002), 37-40.

Welser, J , et al., "Strain dependence of the performance enhancement in strained-Si n-MOSFETs", *International Electron Devices Meeting 1994. Technical Digest*, (Dec. 11-14, 1994),373-376.

Xuan, Peiqi , et al., "60nm Planarized Ultra-thin Body Solid Phase Epitaxy MOSFETs", *IEEE Device Research Conference, Conference Digest. 58th DRC.* (Jun. 19-21, 2000),67-68.

Zhu, Z H., et al., "Wafer bonding and its application on compliant universal (CU) substrates", *Conference Proceedings, 10th Annual Meeting IEEE Lasers and Electro-Optics Society*, (Nov. 10-13, 1996),31.

Zhu, Z H., et al., "Wafer bonding technology and its applications in optoelectronic devices and materials", *IEEE Journal of Selected Topics in Quantum Electronics*, (Jun. 1997),927-936.

Abe, T., "Silicon Wafer-Bonding Process Technology for SOI Structures", *Extended Abstracts of the 22nd (1990 International) Conference on Solid State Devices and Materials*, (1990),853-856.

Berti, M., "Composition and Structure of Si-Ge Layers Produced by Ion Implantation and Laser Melting", *Journal of Materials Research*, 6(10), (Oct. 1991),2120-2126.

Berti, M., "Laser Induced Epitaxial Regrowth of $Si_{1-x}Ge_x$/Si Layers Produced by Ge Ion Implantation", *Applied Surface Science*, 43, (1989),158-164.

Chilton, B T., et al., "Solid phase epitaxial regrowth of strained $Si_{1-x}Ge_x$/Si strained-layer structures amorphized by ion implantation", *Applied Physics Letters*, 54(1), (Jan. 2, 1989),42-44.

Garcia, G A., et al., "High-quality CMOS in thin (100 nm) silicon on sapphire", *IEEE Electron Device Letters*, 9(1), (Jan. 1988),32-34.

Harendt, Christine , "Silicon on Insulator Material by Wafer Bonding", *Journal of Electronic Materials*, 20(3), (Mar. 1991),267-77.

Jurczak, M , "SON (silicon on nothing)-a new device architecture for the ULSI era", *VLSI Technology, 1999. Digest of Technical Papers. 1999 Symposium on* , Jun. 14-16, 1999, 29-30.

Kostrzewa, M , et al., "Testing the Feasibility of strain relaxed InAsP and InGaAs compliant substrates", *EMC 2003 International Conference Indium Phosphide and Related Materials. Conference Proceedings*, Other authors: G. Grenet et al,(Jun. 2003),8-9.

Lasky, J. B., "Wafer Bonding for Silicon-on-Insulator Technologies", *Applied Physics Letters*, 48(1), (Jan. 6, 1986),78-80.

Lu, D, , "Bonding Silicon Wafers by Use of Electrostatic Fields Followed by Rapid Thermal Heating", *Materials Letters*, 4(11), (Oct 1986),461-464.

Moran, Peter , "Strain Relaxation in Wafer-Bonded SiGe/Si Heterostructures Due to Viscous Flow of an Underlying Borosilicate Glass", *Electronic Materials Conference, Santa Barbara*, Jun. 2002, Abstract, pp. 8-9.

Mumola, P. B., et al., "Recent advances in thinning of bonded SOI wafers by plasma assisted chemical etching", *Proceedings of the Third International Symposium on Semiconductor Wafer Bonding: Physics and Applications*, (1995),28-32.

Paine, D. C., "The Growth of Strained $Si_{1-x}Ge_x$ Alloys on <100> Silicon Using Solid Phase Epitaxy", *Journal of Materials Research*, 5(5), (May 1990), 1023-1031.

Sato, T , "Trench Transformation Technology Using Hydrogen Annealing for Realizing Highly Reliable Device Structure With Thin Dielectric Films", *1998 Symposium on VLSI Technology Digest of Technical Papers*, (1998),206-7.

Suni, T , et al., "Effects of Plasma Activation on Hydrophilic Bonding of Si and $SiO_2$", *Journal of the Electrochemical Society*, 149, (2002),G348-51.

Verdonckt-Vandebroek,, Sophie , et al., "SiGe-Channel Heterojunction p-MOSFET's", *IEEE Transactions on Electron Devices*, 41(1), (Jan. 1994), 90-101.

Yin, Haizhou, "High Ge-Content Relaxed $Si_{1-x}$ Layers by Relaxation on Complaint Substrate with Controlled Oxidation", *Electronic Materials Conference, Santa Barbara*, Jun. 2002,8.

Lu, X. , et al., "SiGe and SiGeC Surface Alloy Formation Using High-Dose Implantation and Solid Phase Epitaxy", *Proceedings of the 11th International Conference on Ion Implantation Technology*, Austin, TX, (1997), 686-689.

Kal, S. , et al., "Strained Silicon-SiGe Devices Using Germanium Implantation", *IETE Journal of Research*, 43 (2-3), (Mar. 1997), 185-192.

Xiao, Q. , et al., "Preparation of thin Strained Si Film by Low Temperature Ge Ion Implantation and High Temperature Annealing", *Solid-State and Integrated Circuits Technology, 2004. Proceedings 7th Int'l Conf.*, 3(3), (Oct. 18, 2004), 2163-2166.

* cited by examiner

LOCALIZED STRAINED SEMICONDUCTOR ON INSULATOR

CROSS REFERENCE TO RELATED APPLICATIONS

This application is related to the following commonly assigned U.S. patent applications which are herein incorporated by reference in their entirety: "Output Prediction Logic Circuits With Ultra-Thin Vertical Transistors and Methods of Formation," U.S. application Ser. No. 10/164,611, filed on Jun. 10, 2002; "Micro-Mechanically Strained Semiconductor Film," U.S. application Ser. No. 10/379,749, filed on Mar. 5, 2003; "Strained Si/SiGe Structures By Ion Implantation," U.S. application Ser. No. 10/431,134, filed on May 7, 2003; "Strained Silicon By Wafer Bonding With Misorientation," U.S. application Ser. No. 10/425,484, filed on Apr. 29, 2003; "Micromechanical Strained Silicon By Wafer Bonding," U.S. application Ser. No. 10/431,137, filed on May 7, 2003.

TECHNICAL FIELD

This disclosure relates generally to semiconductor structures, and more particularly, to strained semiconductor on insulator structures.

BACKGROUND

Two areas of interest for improving the speed and performance of semiconductor devices include strained silicon and silicon on insulator technologies. Strained silicon technology has been shown to enhance carrier mobility in both n and p-channel devices, and is being considered to improve the electron mobility and drift velocity in n-channel MOSFET's in CMOS technology. Silicon on insulator structures have been shown to reduce parasitic capacitances, and to increase switching speed of digital circuits and frequency in radio frequency (RF) circuits.

One technique for producing strained silicon involves growing silicon (Si) layers on relaxed silicon-germanium (SiGe) layers. A large mismatch in the cell structure between the Si and SiGe layers causes a pseudo-morphic layer of Si on relaxed SiGe to be under biaxial tensile strain. The biaxial strain modifies the band structure and enhances carrier transport in the Si layer. For example, a 1% strain of the silicon layer almost doubles the electron mobility. One method for forming the strained Si layer on the relaxed SiGe layer involves epitaxially growing the Si and SiGe layers using an ultra-high vacuum chemical vapor deposition (UH-VCVD) process, and is a costly and complex process.

A proposed back end approach for straining silicon applies uniaxial strain to wafers/dies after the integrated circuit process is complete. The dies are thinned to membrane dimensions and then affixed to curved substrates to apply an in-plane, tensile strain after device manufacture. Another method for straining silicon forms voids in a transistor structure to produce a localized mechanical strain in the silicon.

One technique for fabricating a silicon-on-insulator structure involves a SIMOX (Separation by IMplantation of OXygen-Silicon-On-Insulator) process. The SIMOX process uses a very high dose and high energy oxygen implant followed by an oxide growth to form a deep and thick buried oxide (BOX) region. The SIMOX process typically forms a BOX region 3000 Å thick or thicker. The silicon layer over the BOX region is typically 1000 Å or thicker.

There is a need in the art to provide improved semiconductor structures, and to provide methods of forming improved semiconductor structures, that improve the speed and performance of semiconductor devices through increased mobility and decreased stray capacitive loading.

SUMMARY

The above mentioned problems are addressed and will be understood by reading and studying this specification. Various embodiments of the present invention relate to strained semiconductor films along with the structures and devices that include strained semiconductor films. Various embodiments of the present invention further relate to methods of forming the strained semiconductor films along with methods of forming structures and devices that include strained semiconductor films.

One aspect relates to a method for straining a transistor body region. In various embodiments, oxygen ions are implanted to a predetermined depth in a localized region of a semiconductor substrate, and the substrate is annealed. Oxide growth within the semiconductor substrate forms a local oxide region within the semiconductor substrate. A portion of the substrate forms a semiconductor layer over the local oxide region. The semiconductor layer has a thickness of approximately 300 Å or less. The oxide growth strains the semiconductor layer. An active region, including the body region, of the transistor is formed in the strained semiconductor layer.

One aspect relates to a transistor structure. Various embodiments of the transistor include a semiconductor substrate, and a localized insulator region formed within the substrate to partially separate a semiconductor layer from the semiconductor substrate. The semiconductor layer has a strain induced by growth of the insulator region. The strained semiconductor layer having a thickness of approximately 300 Å or less. First and second diffusion regions are formed in the strained semiconductor layer over the insulator region. The first and second diffusion regions are separated by a body region in the strained semiconductor layer. A gate is positioned over the body region, and is separated from the body region by a gate dielectric.

In various embodiments, the semiconductor substrate includes a silicon substrate, the strained semiconductor layer includes a strained silicon layer, and the insulator region includes an oxide region. In various embodiments, the oxide region is formed using a SIMOX (Separation by IMplantation of OXygen) process. In various embodiments, the oxide region is formed using a SPIMOX (Separation by Plasma IMplantation of OXygen) process. Various embodiments provide ultra-thin strained silicon body layers for n-channel CMOS transistors. Shallow oxygen implants are formed in a localized area to produce pockets of oxide under a surface layer of silicon. The silicon above the oxide pocket is stretched and strained by a heat treatment process and a resulting oxide growth.

These and other aspects, embodiments, advantages, and features will become apparent from the following description and the referenced drawings.

DETAILED DESCRIPTION

The following detailed description refers to the accompanying drawings which show, by way of illustration, specific aspects and embodiments in which the present invention may be practiced. The various embodiments are not necessarily mutually exclusive as aspects of one embodiment can be combined with aspects of another embodiment. Other embodiments may be utilized and structural, logical, and electrical changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The terms "horizontal" and "vertical", as well as prepositions such as "on", "side", "over" and "under" are used in relation to the conventional plane or surface of a wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Various embodiments provide a local semiconductor structure with a strained semiconductor layer on insulator. Various embodiments provide strained silicon body layers for n-channel transistors. Various embodiments provide advantages for CMOS transistors because of the strained semiconductor on insulator structure. Various embodiments provide a technique to produce ultra-thin strained silicon body layers over a local insulator.

Figure 1:
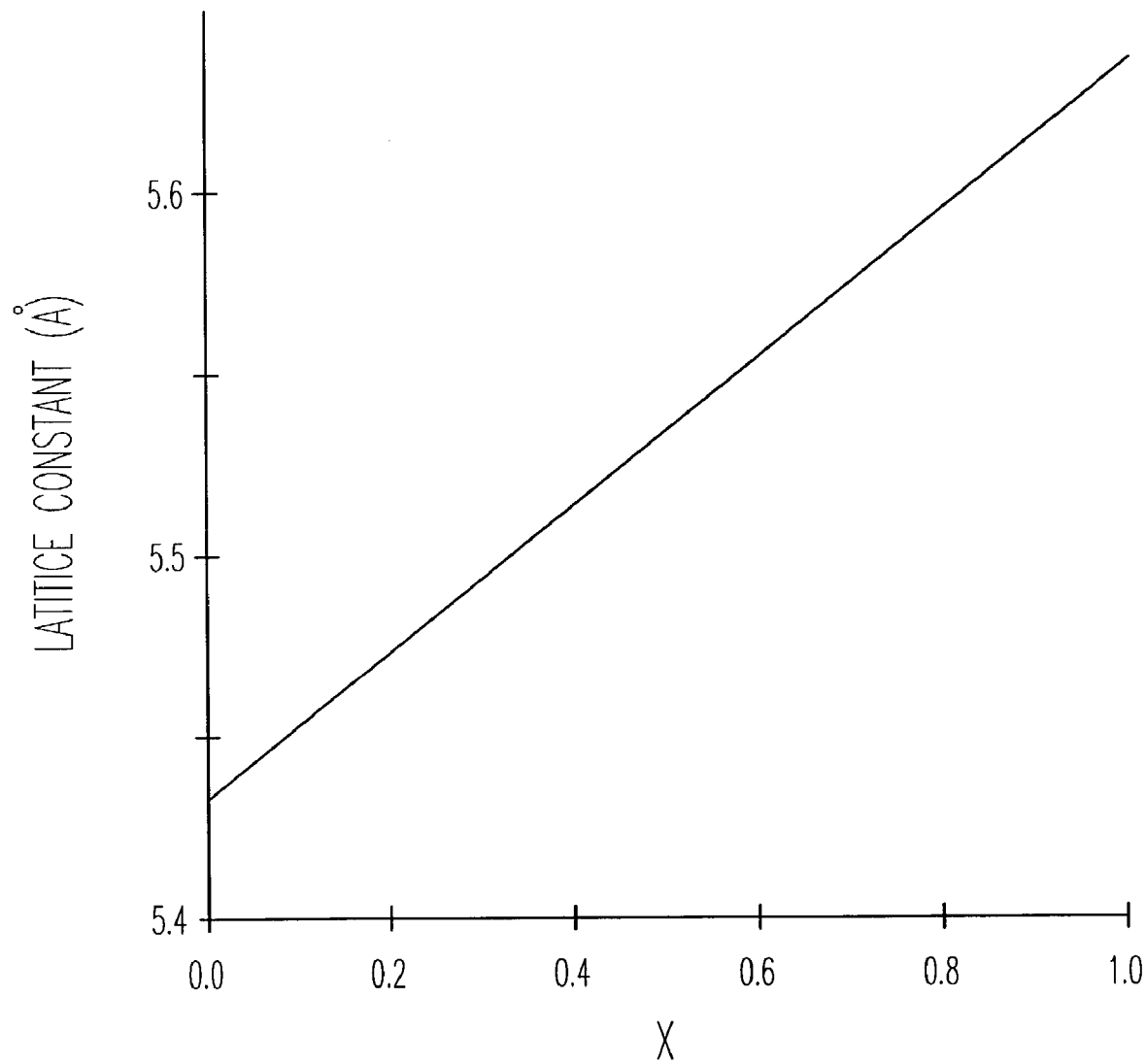
FIG. 1 illustrates the lattice constant of a $Si_{1-X}Ge_X$ substrate for different percentages (X) of Ge.

Mobility is improved by straining semiconductor material. As noted earlier, one technique for producing strained silicon involves growing silicon (Si) layers on relaxed silicon-germanium (SiGe) layers. Si has a lattice constant of 5.43095 Å, and Ge has a lattice constant of 5.64613 Å. The lattice constant of SiGe is between the lattice constant of Si and the lattice constant of Ge, and depends on the percentage of Ge in the SiGe layer. FIG. 1 illustrates the lattice constant of a $Si_{1-X}Ge_X$ substrate for different percentages (X) of Ge. As indicated by FIG. 1, a $Si_{1-X}Ge_X$ substrate containing about 30% Ge (X≈0.3) has a lattice constant of about 5.50 Å. The biaxial strain of the Si on the SiGe can be calculated as follows:

$$\text{Biaxial\_Strain} = \frac{SiGe_{LC} - Si_{LC}}{Si_{LC}}, \quad (1)$$

where the subscript LC represents the lattice constant of the SiGe or Si. Thus, as shown in Equation 2, the Si on the SiGe substrate has a biaxial strain of about 1.28%.

$$\text{Biaxial\_Strain} \approx \frac{5.50 - 5.43}{5.43} = 1.28\%. \quad (2)$$

Figure 2:
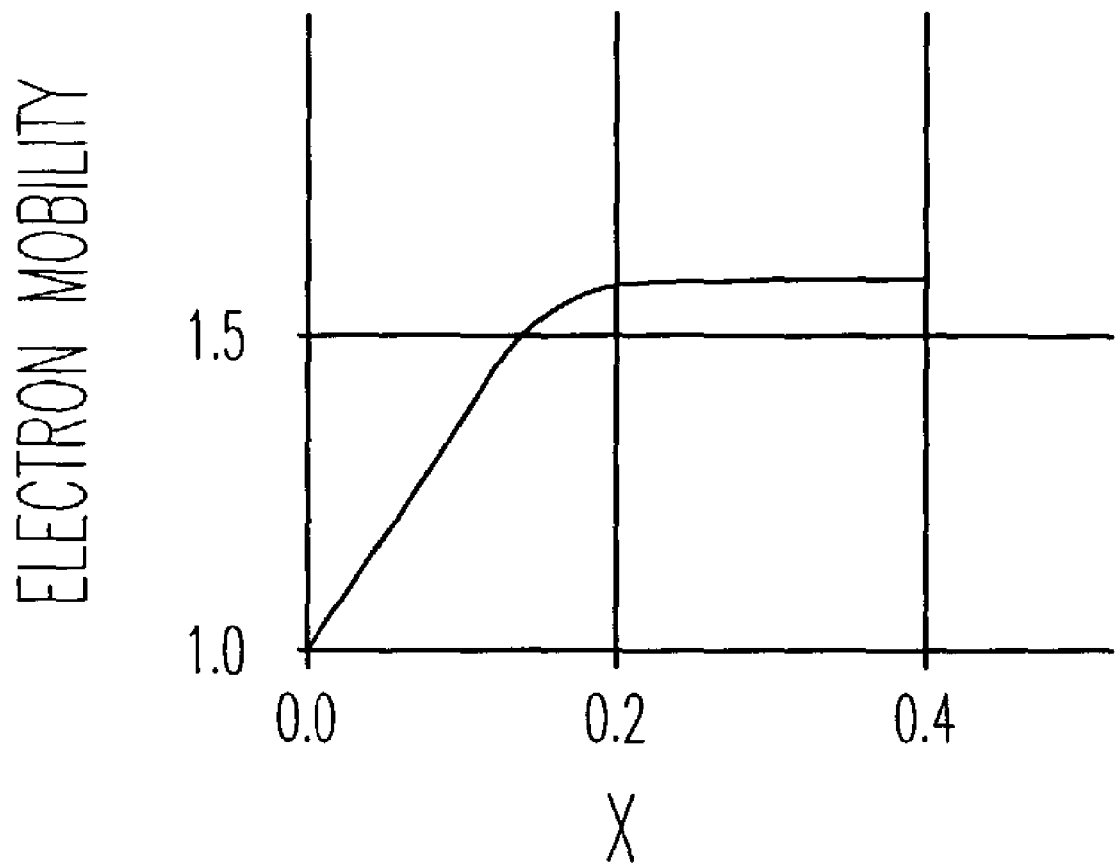
FIG. 2 illustrates the mobility enhancement for strained Si for different percentages (X) of Ge in a $Si_{1-X}Ge_X$ substrate.

FIG. 2 illustrates the mobility enhancement for strained Si for different percentages (X) of Ge in a $Si_{1-X}Ge_X$ substrate. The mobility enhancement increases as the percentage of Ge in the $Si_{1-X}Ge_X$ increases, and levels off to around 1.6 when the percentage of Ge is around 22% or larger. Referring to FIG. 1, 22% Ge provides the $Si_{1-X}Ge_X$ substrate with a lattice constant ($SiGe_{LC}$) of around 5.485. Using Equation 1, it is determined that the corresponding strain for 22% Ge (the approximate point where the mobility enhancement levels off) is about 1%.

When the percentage of Ge in the $Si_{1-X}Ge_X$ is about 20% (near the knee of the curve), it can be calculated that the resulting strain is about 0.75%. When the percentage of Ge in the $Si_{1-X}Ge_X$ is about 40%, it can be calculated that the resulting strain is about 1.5%. Referring again to FIG. 1, it can be seen that a $Si_{1-X}Ge_X$ substrate having just under 10% Ge still provides considerable mobility enhancement (1.3). A $Si_{1-X}Ge_X$ substrate having just under 10% Ge provides the $Si_{1-X}Ge_X$ substrate with a lattice constant ($SiGe_{LC}$) of around 5.457. Using Equation 1, it is determined that the corresponding strain is around 0.5%. Thus, it is desirable to achieve a biaxial strain around or greater than 0.5%, and preferably around 1% or greater to obtain the desired enhanced mobility associated with strained Si.

Figure 3:
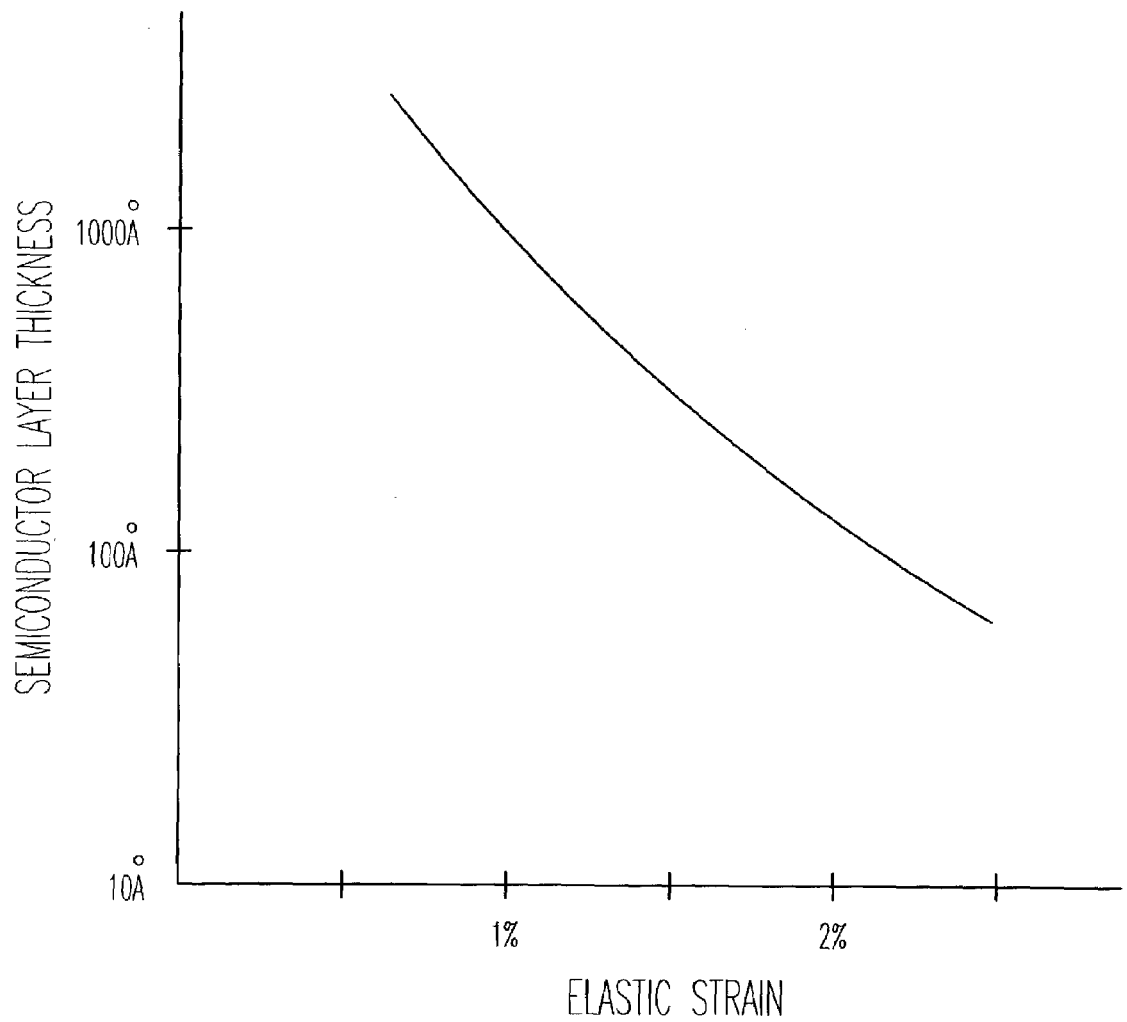
FIG. 3 illustrates a relationship between elastic strain and semiconductor layer thicknesses.

Various embodiments of the present invention mechanically induce a strain in thin semiconductor layers, such as ultra thin silicon layers having a thickness around 300 Å or less. FIG. 3 illustrates a relationship between elastic strain and semiconductor layer thicknesses. The semiconductor yield is plotted with respect to plastic deformation and defects in bulk samples. The illustrated values represent the relationship of thin SiGe layers on silicon. FIG. 3 illustrates that thin layers of silicon or other semiconductor materials are more tolerant of strain than thick bulk samples. Previously, thin layers of SiGe have been fabricated on silicon because of the tolerance of the thin layers to strain. FIG. 3 indicates that 300 Å thin semiconductor layers can be strained up to about 2%. However, as illustrated earlier with respect to FIG. 2, the mobility enhancement levels off when the strain reaches about 1%.

It is thus desirable to strain a thin semiconductor layer with a strain greater than 0.5% to achieve significant mobility enhancement. It is desirable to strain a thin semiconductor layer, such as an ultra-thin layer approximately 300 Å. or less, with a strain within a range of approximately 0.75% to approximately 1.5% where the mobility enhancement levels off. It is also desirable to reduce unnecessary strain and provide a margin for error without unduly affecting the mobility enhancement. Thus, it is desirable to strain a thin semiconductor layer with a strain in the range of approximately 1% to approximately 1.2%.

As noted earlier, silicon on insulator structures have been shown to reduce parasitic capacitances, and to increase switching speed of digital circuits and frequency in radio frequency (RF) circuits. One technique for fabricating a silicon-on-insulator structure involves a SIMOX (Separation by IMplantation of OXygen-Silicon-On-Insulator) process. The SIMOX process uses a very high dose and high energy oxygen implant followed by an oxide growth to form a deep and thick buried oxide (BOX) region. The BOX region is typically 3000 Å thick or thicker and the silicon layer over the BOX region is typically 1000 Å or thicker when the SIMOX process has been used. The SIMOX process is an expensive process. Other problems with the SIMOX process involve the large number of defects introduced by the high dose (typically of the order $10^{18}/cm^2$) and high energy oxygen implant required to form the thick BOX regions, and introduced by the strain caused during the subsequent oxide growth under the silicon layer.

During research to develop self-assembled growth of nanostructures that are free from the optical lithography minimum feature size limit, silicon was strained using localized SIMOX implants (line or ring formation), and epitaxial Ge was grown on the strained areas of the silicon. Epitaxial Ge does not grow on normal silicon wafers because of the larger lattice constant of Ge. The resulting biaxial strain in the silicon did not match the Ge lattice constant, thus only small islands of Ge grew.

Various embodiments of the present invention mechanically strain a thin semiconductor layer and use the mechanically-strained semiconductor in an active region of a device. The thin semiconductor layer is also referred to herein as an ultra-thin semiconductor layer. Various ultra-thin semiconductor layer embodiments have a thickness of approximately 300 Å or less. The semiconductor layer is mechanically strained by growing a local insulator region to partially separate the semiconductor layer from a semiconductor substrate. The local insulator region is formed underneath where the active region of the device is to be formed. The amount of strain in the semiconductor layer over the local insulator region is controlled by controlling the size and shape of the insulator region. In various embodiments, a silicon layer is mechanically strained by growing a local oxide region in a silicon substrate to partially separate the silicon layer from a silicon substrate.

Figure 4:
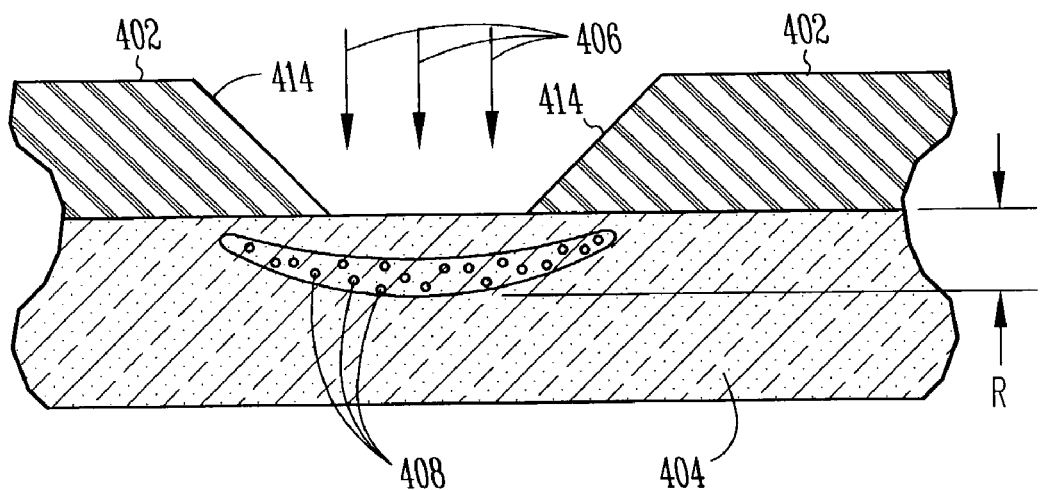
FIG. 4 illustrates a process for forming shallow oxygen implants such as is used in a process to produce strained silicon body layers for n-channel CMOS transistors, according to various embodiments of the present invention.

FIG. 4 illustrates a process for forming shallow oxygen implants such as is used in a process to produce strained silicon body layers for n-channel CMOS transistors, according to various embodiments of the present invention. A mask 402 is formed over a silicon substrate 404 to define a local area corresponding to a desired location of a transistor. Oxygen ions are implanted, as represented by the arrows 406, to form shallow oxygen implants 408. In various embodiments, the range (R), or depth, of the oxygen implants is 300 Å or less to form an ultra-thin, strained silicon body layer upon completion of the process.

In various embodiments, the illustrated process for forming the shallow oxygen implants involves a SIMOX process. The layer thicknesses illustrated in FIG. 4 are much thinner than conventional SIMOX processes. Conventional SIMOX use very high dose and high energy implants, which can cause an unacceptable amount of damage in the silicon surface layer. In conventional SIMOX processes to form conventional non-local BOX regions, a silicon layer over the BOX region is typically 1000 Å or thicker, and the BOX region is typically 3000 Å thick. These dimensions correspond to a large volume of oxide and high oxygen dose, typically of the order $10^{18}/cm^2$ and energies of 180 KeV. Thus, in various embodiments, the illustrated process for forming the shallow oxygen implants involves a SPIMOX (Separation by Plasma Implantation of Oxygen-Silicon-On-Insulator) process. A SPIMOX process only requires an oxygen dose of the order $10^{17}/cm^2$ and energies of 60 KeV. One of ordinary skill in the art will understand, upon reading and comprehending this disclosure, how to use SIMOX and SPIMOX processes to form oxygen implants and produce strained body layers in accordance with the present subject matter.

Figure 5:
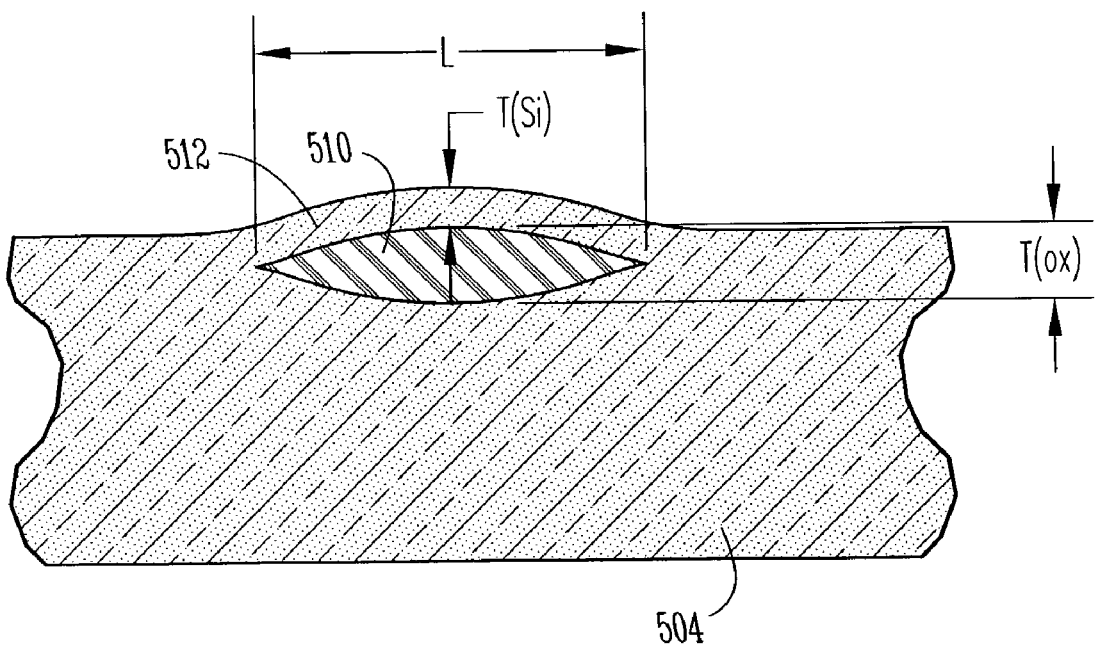
FIG. 5 illustrates a process for forming a buried oxide (BOX) region from the shallow oxygen implants such as is used in a process to produce strained silicon body layers for n-channel CMOS transistors, according to various embodiments of the present invention.

FIG. 5 illustrates a process for forming a buried oxide (BOX) region from the shallow oxygen implants such as is used in a process to produce strained silicon body layers for n-channel CMOS transistors, according to various embodiments of the present invention. The substrate 504 is heat treated or annealed such that an oxide pocket 510, also referred to herein as a BOX region, is formed by the localized shallow oxygen implants 408 shown in FIG. 4. The resulting oxide growth partially separates a surface silicon layer 512 from the substrate 504. The edges of the silicon layer 512 remain attached to the substrate 504. The growth of the BOX region 510 strains this silicon layer 512 over the BOX region 510.

The illustrated silicon layer 512 has a thickness T(Si), and the illustrated BOX region 510 has a thickness T(OX). Additionally, the footprint area of the BOX region 510 within the substrate 504 generally corresponds to the local area corresponding to the desired location of the transistor. The BOX region 510 has a length L. The thickness of the silicon layer is an ultra-thin silicon layer corresponding to a thickness of 300 Å or less. One of ordinary skill in the art will understand, upon reading and comprehending this disclosure, that the dose and energy of the ion implants as well as the mask design are capable of being engineered to form an oxide region with a desired size and shape, and thus provide a desired strain in the silicon layer.

Referring to both FIG. 4 and 5, various embodiments use an oxide mask 402 with a tapered region or edge 414 proximate to the local area. As illustrated in FIG. 4, the sloping oxide edge of the implant mask absorbs some of the implanted oxygen such that fewer oxygen ions 406 penetrate the silicon substrate through the tapered region 414, and those oxygen ions that do penetrate through the tapered region 414 penetrate the substrate 404 to a shallower depth, as represented by the portion 416 of the oxygen implants that extends closer to the substrate surface. The use of this tapered mask produces a BOX region 510 with a tapered shape when the shallow oxygen implants 408 are annealed. The tapered mask and the implant process can be engineered to provide a desired tapered shape of the resulting BOX region 510 to provide the silicon layer 512 over the BOX region 510 with a relatively uniform strain.

Figure 6A:
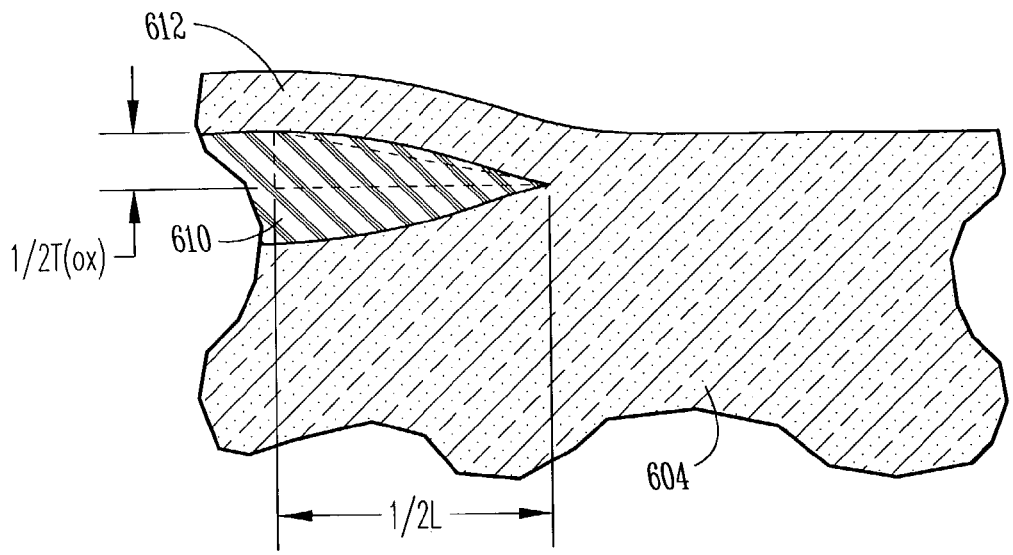
FIGS. 6A and 6B illustrate the strain in the semiconductor layer achieved by the process to produce strained silicon body layers for n-channel CMOS transistors illustrated in FIGS. 4 and 5.
Figure 6B:
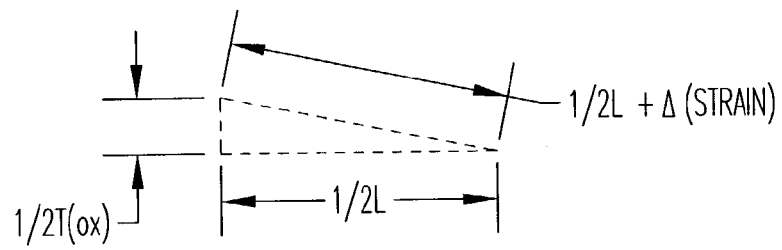

FIGS. 6A and 6B illustrate the strain in the semiconductor layer achieved by the process to produce strained silicon body layers for n-channel CMOS transistors illustrated in FIGS. 4 and 5. According to various embodiments using either conventional ion implantation such as SIMOX or SPIMOX, a BOX region 610 is formed in the substrate 604 at an average distance of about 325 Å under the substrate surface. The illustrated BOX region 610 has a length (L) of approximately 3000 Å and a thickness (T(OX)) of about 450 Å, such that the BOX region 610 extends from approximately 100 Å to 550 Å below the substrate surface. Thus, an ultra-thin layer 612 of approximately 100 Å remains over the BOX region 610. Referring to FIG. 6B, the growth of the BOX region displaces the 100 Å surface layer of silicon upwards by about 225 Å (½ of T(OX)). The original length of the silicon layer increases by a change (Δ) corresponding to the strain induced in the silicon layer. Thus, as illustrated in FIG. 6B, half the length of the silicon layer (½ of L) increases by a Δ (strain). If the distance to the edge of the BOX region is 1500 Å (½ of L), then it can be calculated that a 1.1% strain of the silicon surface layer results from the growth of the illustrated BOX region 610 that has a thickness of approximately 450 Å and a length of approximately 3000 Å. Thus, various embodiments of the present invention are capable of mechanically straining the ultra-thin silicon layer within the desired range of approximately 1% to approximately 1.2% to achieve a desired mobility enhancement with an appropriate margin for error and without unnecessarily straining the ultra-thin silicon layer.

Figure 7:
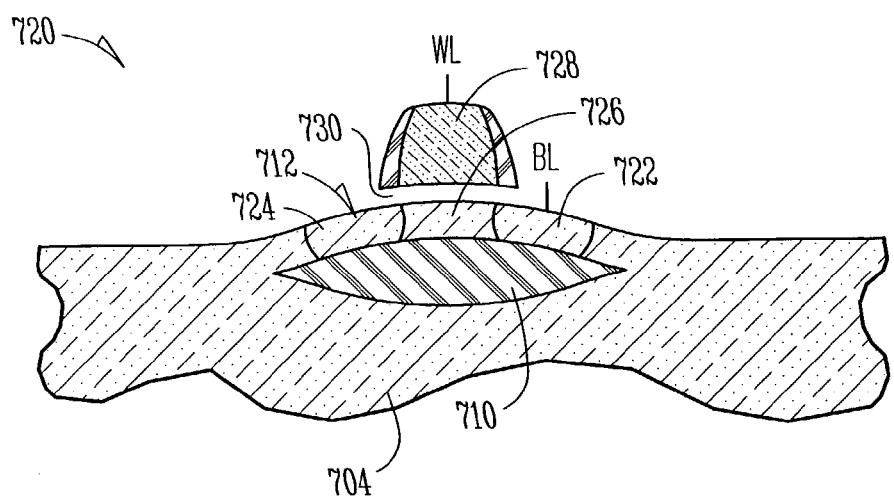
FIG. 7 illustrates an n-channel CMOS transistor with a strained channel, according to various embodiments of the present invention.

FIG. 7 illustrates an n-channel CMOS transistor with a strained channel, according to various embodiments of the present invention. Conventional techniques can be used to from n-channel CMOS transistors with a strained silicon channel. Upon reading and comprehending this disclosure, one of ordinary skill in the art will appreciate that the illustrated n-channel CMOS transistor is not drawn to scale, as the vertical dimensions have been expanded to better illustrate the structure.

The illustrated structure includes a silicon substrate 704 with a local BOX region 710 formed therein at a location corresponding to the desired location of the transistor. The formation of the BOX region 710 partially separates a silicon layer 712, which can also be referred to as a surface silicon layer, from the remainder of the silicon substrate 704. This silicon layer 712 is strained. The illustrated BOX region 710 has a tapered shape, which provides an approximate uniform strain to the silicon layer 712. Conventional techniques can be used to form the transistor 720 using the locally strained and insulated silicon layer 712. Diffusion regions 722 and 724 are formed in the strained silicon layer 712 over the local BOX region 710. In various embodiments, the diffusion regions are implanted with n+ dopants. A strained body region 726 is between the diffusion regions 722 and 724. A gate 728 is operably positioned over and separated from the strained body region 726 by a gate dielectric 730. The illustrated structure shows a word (WL) line connected to the gate 728 and a bit line (BL) connected to one of the diffusion regions 722.

In various embodiments, the strained body region 726 is formed in an ultra-thin silicon layer having a thickness of approximately 300 Å or less. In various embodiments, the strained body region 726 is formed in an ultra-thin silicon layer having a thickness of approximately 100 Å or less. In various embodiments, the strained body region 726 is formed in an ultra-thin silicon layer having a thickness of approximately 50 Å or less. In various embodiments, the strained body region 726 is formed in an ultra-thin silicon layer having a thickness within a range of approximately 20 Å to approximately 30 Å.

Figure 8:
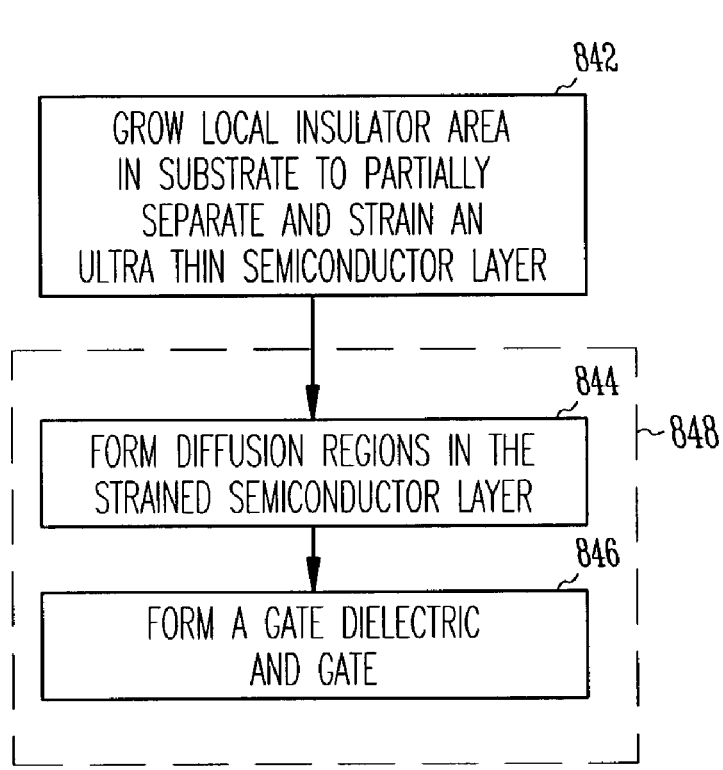
FIG. 8 illustrates a method for forming a device with an ultra-thin strained semiconductor layer, according to various embodiments of the present invention.

FIG. 8 illustrates a method for forming a device with an ultra-thin strained semiconductor layer, according to various embodiments of the present invention. In various embodiments of the method 840, as represented at 842, a local insulator area, such as an oxide region, is grown in a substrate to partially separate and strain an ultra-thin semiconductor layer from the substrate. At 844, diffusion regions are formed in the strained semiconductor layer, and at 846, a gate dielectric and a gate are operably formed over the strained semiconductor layer. Formation of the diffusion regions at 844 and the gate dielectric and gate at 846 form a transistor using the strained semiconductor layer, as generally represented at 848.

Figure 9:
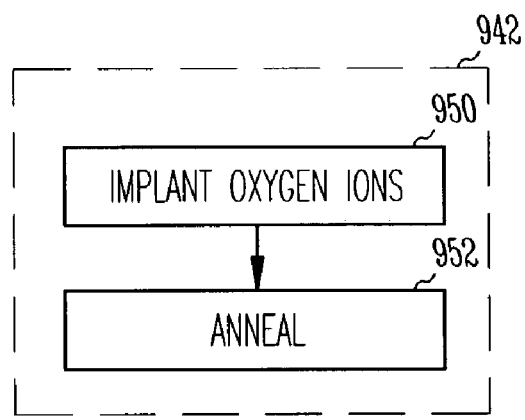
FIG. 9 illustrates a method for growing a local insulator area in a substrate, according to various embodiments of the present invention.

FIG. 9 illustrates a method for growing a local insulator area in a substrate, according to various embodiments of the present invention. In various embodiments for growing a local insulator area in a substrate 942, a local insulator area is grown by implanting oxygen ions, as represented at 950, and the substrate is annealed, as represented at 952. Various embodiments use a SIMOX process, and various embodiments use a SPIMOX process to grow the local insulator area.

Figure 10:
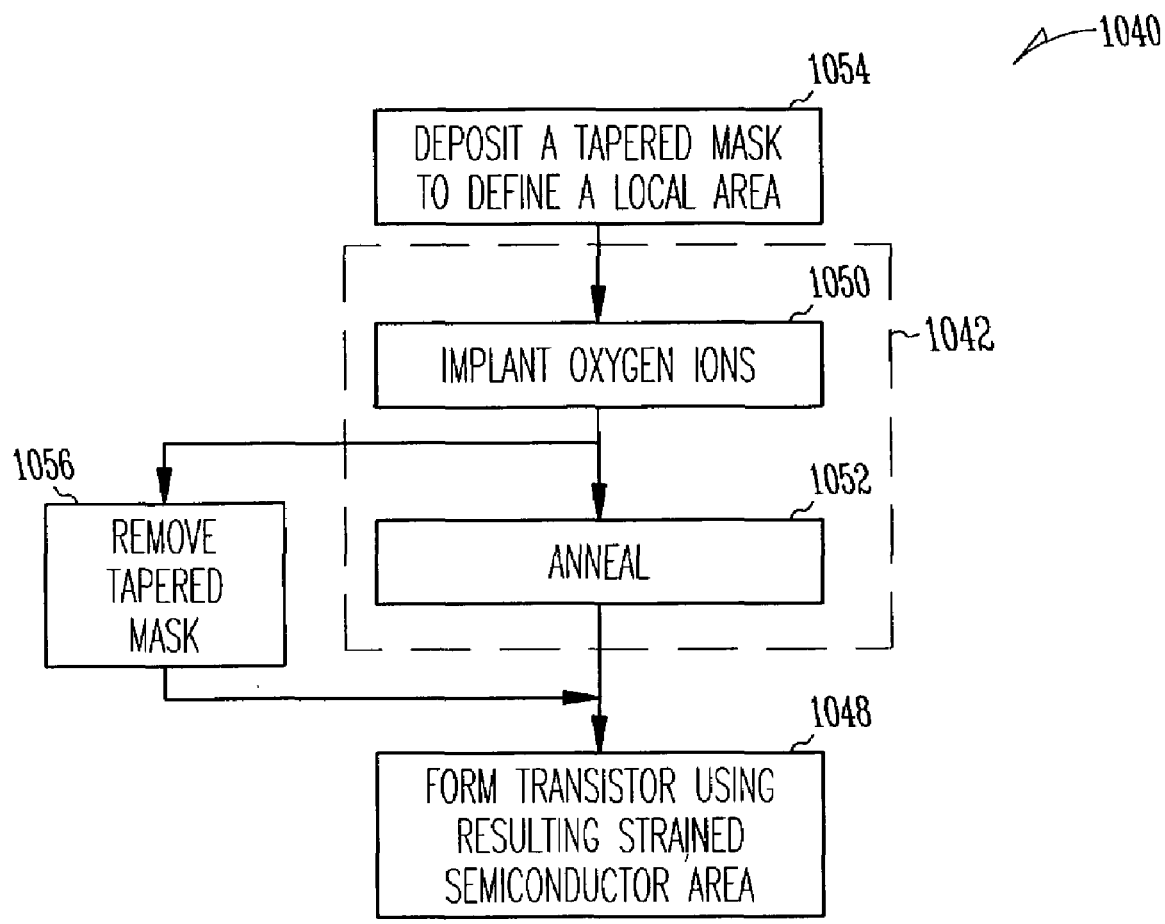
FIG. 10 illustrates a method for forming a device with an ultra-thin semiconductor layer with an approximate uniform strain, according to various embodiments of the present invention.

FIG. 10 illustrates a method for forming a device with an ultra-thin semiconductor layer with an approximate uniform strain, according to various embodiments of the present invention. In various embodiments of the method 1040, as represented at 1054, a tapered mask is deposited on a substrate to define a local area where a transistor device is to be formed. A local insulator area is grown at 1042. In various embodiments, the local insulator area is grown by implanting oxygen ions into the local area of the substrate at 1050, and annealing or heat-treating the substrate to grow an oxide at 1052. The resulting growth of the oxide induces a strain in a surface layer of silicon that is separated from the silicon substrate. At 1056, the tapered mask is removed at an appropriate time in the process, and a transistor is formed using the resulting strained semiconductor layer at 1048.

Figure 11:
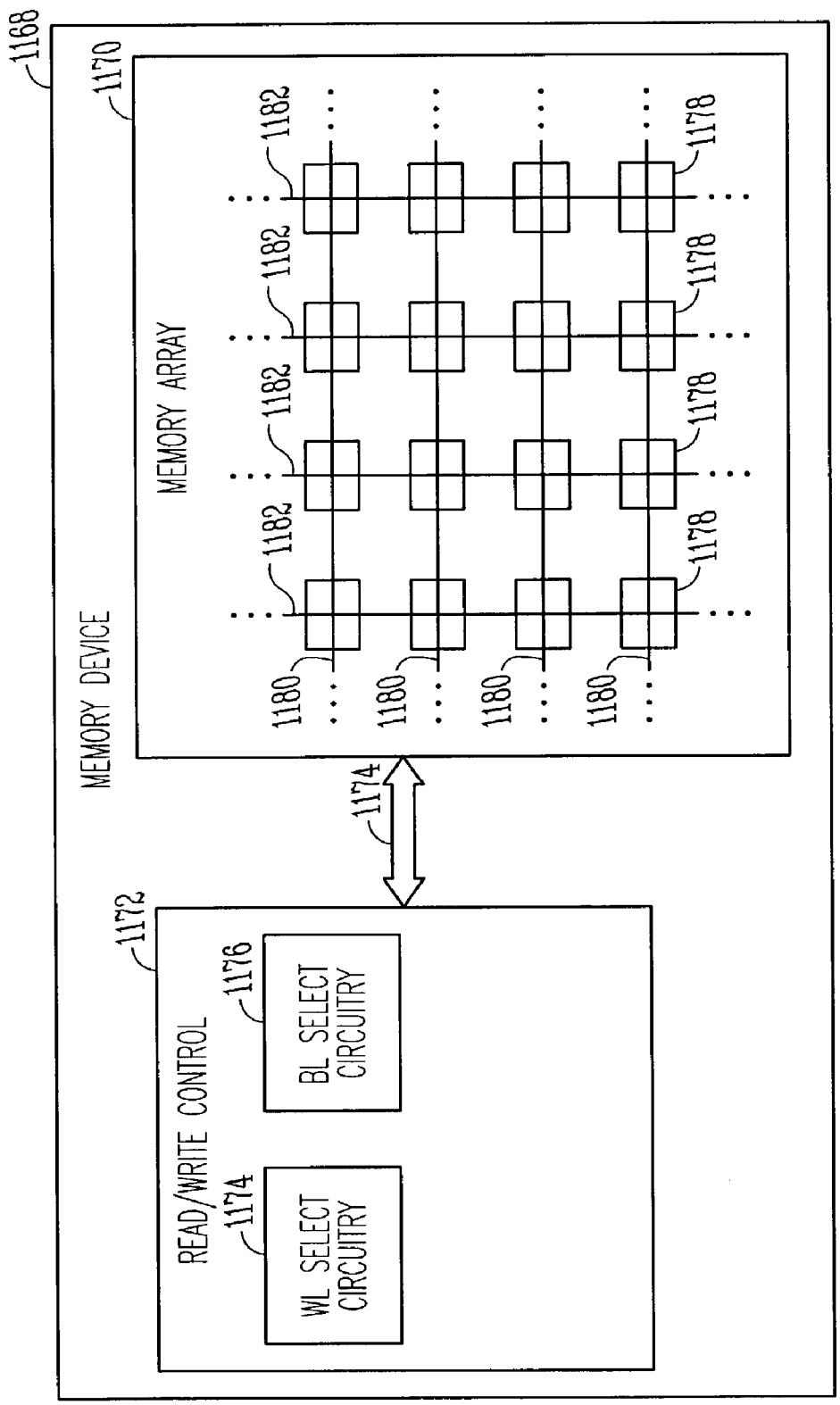
FIG. 11 is a simplified block diagram of a high-level organization of various embodiments of a memory device according to various embodiments of the present invention.

FIG. 11 is a simplified block diagram of a high-level organization of various embodiments of a memory device according to various embodiments of the present invention. The illustrated memory device 1168 includes a memory array 1170 and read/write control circuitry 1172 to perform operations on the memory array via communication line(s) 1174. The illustrated memory device 1168 may be a memory card or a memory module such as a single inline memory module (SIMM) and dual inline memory module (DIMM). One of ordinary skill in the art will understand, upon reading and comprehending this disclosure, that semiconductor components in the memory array 1170 and/or the control circuitry 1172 are able to be fabricated using the strained semiconductor films, as described above. For example, in various embodiments, the memory array 1170 and/or the control circuitry 1172 include transistors with strained, ultra-thin body layers. The structure and fabrication methods for these strained, ultra-thin body layers have been described above.

The memory array 1170 includes a number of memory cells 1178. The memory cells in the array are arranged in rows and columns. In various embodiments, word lines 1180 connect the memory cells in the rows, and bit lines 1182 connect the memory cells in the columns. The read/write control circuitry 1172 includes word line select circuitry 1174, which functions to select a desired row. The read/write control circuitry 1172 further includes bit line select circuitry 1176, which functions to select a desired column.

Figure 12:
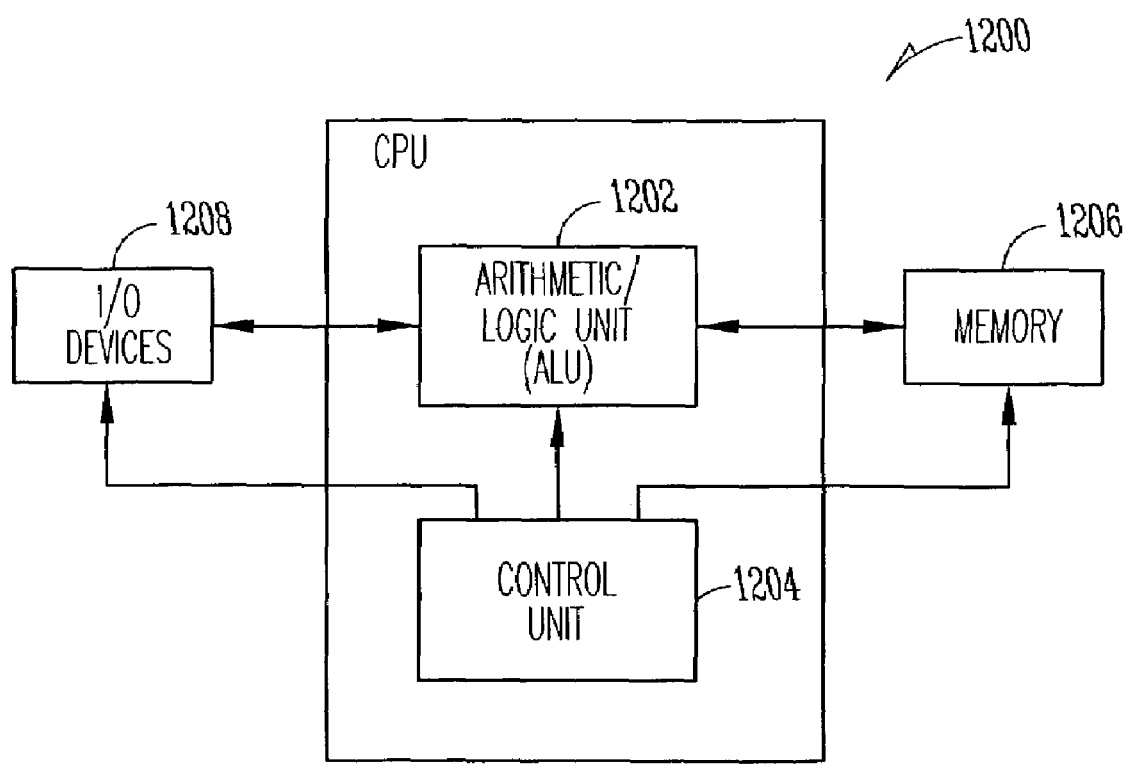
FIG. 12 is a simplified block diagram of a high-level organization of various embodiments of an electronic system according to the present invention.

FIG. 12 is a simplified block diagram of a high-level organization of various embodiments of an electronic system according to the present invention. In various embodiments, the system 1200 is a computer system, a process control system or other system that employs a processor and associated memory. The electronic system 1200 has functional elements, including a processor or arithmetic/logic unit (ALU) 1202, a control unit 1204, a memory device unit 1206 (such as illustrated in FIG. 11) and an input/output (I/O) device 1208. Generally such an electronic system 1200 will have a native set of instructions that specify operations to be performed on data by the processor 1202 and other interactions between the processor 1202, the memory device unit 1206 and the I/O devices 1208. The control unit 1204 coordinates all operations of the processor 1202, the memory device 1206 and the I/O devices 1208 by continuously cycling through a set of operations that cause instructions to be fetched from the memory device 1206 and executed. According to various embodiments, the memory device 1206 includes, but is not limited to, random access memory (RAM) devices, read-only memory (ROM) devices, and peripheral devices such as a floppy disk drive and a compact disk CD-ROM drive. As one of ordinary skill in the art will understand, upon reading and comprehending this disclosure, any of the illustrated electrical components are capable of being fabricated to include strained semiconductor films in accordance with various embodiments of the present invention.

The illustration of the system 1200 is intended to provide a general understanding of one application for the structure and circuitry using embodiments of the present invention, and is not intended to serve as a complete description of all the elements and features of an electronic system. As one of ordinary skill in the art will understand, such an electronic system can be fabricated in single-package processing units, or even on a single semiconductor chip, in order to reduce the communication time between the processor and the memory device.

Applications containing strained semiconductor films, such as transistors with a strained ultra-thin semiconductor body layer, as described in this disclosure include electronic systems for use in memory modules, device drivers, power modules, communication modems, processor modules, and application-specific modules, and may include multilayer, multichip modules. Such circuitry can further be a subcomponent of a variety of electronic systems.

CONCLUSION

Various embodiments disclosed herein locally grow an insulator region to partially separate and strain an upper or surface semiconductor layer of the substrate positioned over the insulator region. Thus, a locally strained semiconductor on a local insulator region is provided. In various embodiments, a SPIMOX or SIMOX process is used to form a local BOX region. A tapered mask is used to control the shape of the resulting BOX region to control the strain throughout the semiconductor layer. The locally strained semiconductor layer is used to form a transistor over the BOX region. The strained semiconductor on insulator devices disclosed herein improve the speed and performance of semiconductor devices through increased mobility and decreased stray capacitive loading.

This disclosure includes several processes, circuit diagrams, and cell structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A method for straining a transistor body region, comprising:
   implanting oxygen ions to a predetermined depth in a localized region of a semiconductor substrate; and
   annealing the substrate, wherein:
      annealing the substrate results in oxide growth within the semiconductor substrate, the oxide growth forming a local oxide region within the semiconductor substrate, a portion of the substrate forming a semiconductor layer over the local oxide region, the semiconductor layer having a thickness of approximately 300 Å or less;
      the oxide growth strains the semiconductor layer; and
      an active region, including the body region, of the transistor is formed in the strained semiconductor layer.

2. The method of claim 1, wherein the semiconductor layer has a thickness of approximately 50 Å or less.

3. The method of claim 1, wherein implanting oxygen ions includes implanting oxygen ions with a desired dose and a desired energy such that, upon annealing, the oxide growth strains the semiconductor layer with a strain greater than 0.5%.

4. The method of claim 1, wherein implanting oxygen ions includes implanting oxygen ions with a desired dose and a desired energy such that, upon annealing, the oxide growth strains the semiconductor layer with a strain within a range of approximately 0.75% to 1.5%.

5. The method of claim 1, wherein implanting oxygen ions includes implanting oxygen ions with a desired dose and a desired energy such that, upon annealing, the local oxide region formed by the oxide growth has a length of approximately 3000 Å and a thickness of approximately 450 Å to provide an approximate 1.1% strain in the semiconductor layer.

6. The method of claim 1, wherein implanting oxygen ions includes performing a SIMOX (Separation by IMplantation of OXygen) process.

7. The method of claim 1, wherein implanting oxygen ions includes performing a SPIMOX (Separation by Plasma IMplantation of OXygen) process.

8. A method for straining a transistor silicon body, comprising:
   implanting oxygen ions to a predetermined depth in a localized region of a silicon substrate; and
   annealing the silicon substrate to form a local buried oxide (BOX) region within the silicon substrate, a portion of the substrate forming a silicon layer over the local BOX region, the silicon layer being strained by oxide growth, the resulting strained silicon layer having a thickness of approximately 300 Å or less, wherein the strained silicon layer includes the transistor silicon body.

9. The method of claim 8, wherein implanting oxygen ions includes implanting oxygen ions with a desired dose and a desired energy such that, upon annealing, the resulting strained silicon layer over the BOX region has a thickness of approximately 50 Å or less.

10. The method of claim 8, wherein implanting oxygen ions includes implanting oxygen ions with a desired dose and a desired energy such that, upon annealing, the oxide growth strains the silicon layer with a strain greater than 0.75%.

11. The method of claim 8, wherein implanting oxygen ions includes implanting oxygen ions with a desired dose and a desired energy such that, upon annealing, the oxide growth strains the silicon layer with a strain within a range of approximately 0.75% to 1.5%.

12. The method of claim 8, wherein implanting oxygen ions includes implanting oxygen ions with a desired dose and a desired energy such that, upon annealing, the oxide growth strains the silicon layer with a strain within a range of approximately 1.0% to 1.2%.

13. The method of claim 8, wherein implanting oxygen ions includes implanting oxygen ions with a desired dose and a desired energy such that, upon annealing, the oxide growth forming the local BOX region with a length of approximately 3000 Å and a thickness of approximately 450 Å to provide an approximate 1.1% strain in the silicon layer.

14. A method for straining a silicon body for a transistor, comprising:
   implanting oxygen ions to a predetermined depth in a localized region of a silicon substrate using a SPIMOX (Separation by Plasma IMplantation of OXygen) process; and
   annealing the silicon substrate to form a local buried oxide (BOX) region within the silicon substrate, a portion of the substrate forming a silicon layer over the BOX region, the silicon layer being strained by oxide growth, the resulting strained silicon layer having a thickness of approximately 300 Å or less and a strain within a range of approximately 0.75% to approximately 1.5%, wherein the strained silicon layer includes the transistor silicon body.

15. The method of claim 14, wherein implanting oxygen ions includes implanting oxygen ions with a desired dose and a desired energy such that, upon annealing, the oxide growth forms the local BOX region with a length of approximately 3000 Å and a thickness of approximately 450 Å to provide an approximate 1.1% strain in the silicon layer.

16. The method of claim 14, wherein the local BOX region has a tapered shape such that the strain in the silicon layer is approximately uniform.

17. A method for forming a transistor, comprising:
   forming a local insulator region within a semiconductor substrate such that a portion of the semiconductor substrate forms a semiconductor layer over the local insulator region, wherein the formation of the local insulator region strains the semiconductor layer, the strained semiconductor layer having a thickness of about 300 Å or less;
   forming an active region of the transistor in the strained semiconductor layer over the local insulator region, the active region including first and second diffusion regions separated by a body region;
   forming a gate dielectric over the body region; and
   forming a gate over the gate dielectric.

18. The method of claim 17, wherein forming a local insulator region within a semiconductor substrate includes forming an oxide region within a silicon substrate using a SIMOX (Separation by IMplantation of OXygen) process.

19. The method of claim 17, wherein forming a local insulator region within a semiconductor substrate includes forming an oxide region within a silicon substrate using a SPIMOX (Separation by Plasma IMplantation of OXygen) process.

20. The method of claim 17, forming a local insulator region within a semiconductor substrate strains the semiconductor layer over the local insulator region with a strain within a range of approximately 0.75% to approximately 1.5%.

21. The method of claim 17, wherein forming a local insulator region within a semiconductor substrate strains the semiconductor layer over the local insulator region with a strain within a range of approximately 1.0% to 1.2%.

22. The method of claim 17, wherein forming a local insulator region includes forming a local insulator region with a tapered shape such that the formation of the local insulator region strains the semiconductor layer with an approximately uniform strain.

23. A method for forming a silicon on insulator device, comprising:
   implanting oxygen ions in a localized area of a silicon substrate;
   annealing the substrate to form a localized buried oxide (BOX) region such that a portion of the silicon substrate forms a silicon layer over the BOX region, the silicon layer being strained by growth of the BOX region, the strained silicon layer having a thickness of about 300 Å or less;
   forming first and second diffusion regions in the strained surface layer of silicon, the strained silicon layer between the first and second diffusion regions forming a strained silicon body layer;
   forming a gate dielectric over the strained silicon body layer; and
   forming a gate over the gate dielectric.

24. The method of claim 23, wherein implanting oxygen ions includes performing a SIMOX (Separation by IMplantation of OXygen) process.

25. The method of claim 23, wherein implanting oxygen ions includes performing a SPIMOX (Separation by Plasma IMplantation of OXygen) process.

26. The method of claim 23, wherein implanting oxygen ions into the silicon substrate includes implanting oxygen ions with a desired dose and a desired energy such that, upon annealing, the resulting strained silicon layer over the BOX region has a thickness of approximately 50 Å or less.

27. The method of claim 23, wherein implanting oxygen ions into the silicon substrate includes implanting oxygen ions with a desired dose and a desired energy such that, upon annealing, the oxide growth strains the silicon layer with a strain within a range of approximately 0.75% to 1.5%.

28. The method of claim 23, wherein implanting oxygen ions into the silicon substrate includes implanting oxygen ions with a desired dose and a desired energy such that, upon annealing, the oxide growth strains the silicon layer with a strain within a range of approximately 1.0% to 1.2%.

29. A method for forming a silicon on insulator device, comprising:
   implanting oxygen ions in a localized area of a silicon substrate using a SPIMOX (Separation by Plasma IMplantation of OXygen) process;

annealing the substrate to form a localized buried oxide (BOX) region such that a surface silicon layer over the BOX region is mechanically strained by growth of the BOX region, wherein implanting oxygen ions into the silicon substrate includes implanting oxygen ions with a desired dose and a desired energy such that, upon annealing, the oxide growth forms a silicon layer having a thickness of approximately 300 Å or less and mechanically strains the silicon layer with a strain within a range of approximately 0.75% to 1.5%;

forming first and second diffusion regions in the strained surface layer of silicon, the strained silicon layer between the first and second diffusion regions forming a strained silicon body layer;

forming a gate dielectric over the strained silicon body layer; and forming a gate over the gate dielectric.

30. The method of claim 29, wherein implanting oxygen ions into the silicon substrate includes implanting oxygen ions with a desired dose and a desired energy such that, upon annealing, the oxide growth forms a silicon layer having a thickness of approximately 50 Å or less.

31. The method of claim 29, wherein implanting oxygen ions into the silicon substrate includes implanting oxygen ions with a desired dose and a desired energy such that, upon annealing, the oxide growth forms a silicon layer having a thickness within a range of approximately 20 Å to approximately 30 Å.

32. The method of claim 29, wherein implanting oxygen ions includes implanting oxygen ions with a desired dose and a desired energy such that, upon annealing, the oxide growth forms a BOX region with a length of approximately 3000 Å and a thickness of approximately 450 Å to provide an approximate 1.1% strain in the silicon layer.

33. The method of claim 29, wherein forming first and second diffusion regions in the strained surface layer of silicon includes doping the strained surface layer with n+ type impurities to form the first and second diffusion regions such that the device is an n-channel CMOS transistor.

34. The method of claim 29, wherein the local BOX region has a tapered shape such that the formation of the local BOX region strains the silicon layer with an approximately uniform strain.

35. A method for forming a silicon on insulator device, comprising:

providing a mask on the silicon substrate to define a localized area of the silicon substrate, the mask having tapered portions proximate to the localized area; and implanting oxygen ions in the localized area of a silicon substrate using a SPIMOX (Separation by Plasma IMplantation of OXygen) process, some of the oxygen ions being absorbed by the tapered portion of the mask such that fewer oxygen ions are implanted into the silicon substrate beneath the tapered portion of the mask, annealing the substrate such that oxide growth forms a localized buried oxide (BOX) region, wherein implanting oxygen ions into the silicon substrate includes implanting oxygen ions with a desired dose and a desired energy such that, upon annealing:

the oxide growth forms a silicon layer from the silicon substrate, the silicon layer being formed over the BOX region, the silicon layer having a thickness of approximately 300 Å or less;

the oxide growth strains the silicon layer with a strain within a range of approximately 0.75% to 1.5%; and the resulting oxide region has a tapered shape such that the mechanical strain imposed on the silicon layer is approximately uniform;

forming first and second diffusion regions in the strained surface layer of silicon, the strained silicon layer between the first and second diffusion regions forming a strained silicon body layer;

forming a gate dielectric over the strained silicon body layer; and forming a gate over the gate dielectric.

36. The method of claim 35, wherein implanting oxygen ions includes implanting oxygen ions with a desired dose and a desired energy such that, upon heat treating, the oxide growth forms the BOX region with a length of approximately 3000 Å and a thickness of approximately 450 Å to provide an approximate 1.1% strain in the silicon layer.

37. A method for forming an n-channel CMOS transistor with a strained silicon body layer, comprising:

forming shallow oxygen implants in a localized area of a silicon substrate, wherein the oxygen implants are positioned beneath a surface layer of silicon in which an active region of the transistor will be formed;

heat treating the substrate to grow an oxide region such that the surface layer of silicon is mechanically strained by oxide growth, the surface layer of silicon having a thickness of about 300 Å or less;

forming first and second n+ type diffusion regions in the strained surface layer of silicon, the strained surface layer of silicon between the first and second diffusion regions forming the strained silicon body layer;

forming a gate dielectric over the strained silicon body layer; and forming a gate over the gate dielectric.

38. The method of claim 37, wherein forming shallow oxygen implants in a localized area of a silicon substrate includes performing a SIMOX (Separation by IMplantation of OXygen) process.

39. The method of claim 37, wherein forming shallow oxygen implants in a localized area of a silicon substrate includes performing a SPIMOX (Separation by Plasma IMplantation of OXygen) process.

40. The method of claim 37, wherein the oxide growth strains the silicon body layer over 0.5%.

41. The method of claim 37, wherein the oxide growth strains the silicon body layer with a strain of approximately 0.75% or greater.

42. The method of claim 37, wherein forming shallow oxygen implants in a localized area of a silicon substrate includes:

providing a mask on the silicon substrate to define the localized area of the silicon substrate, the mask having tapered portions proximate to the localized area; and implanting oxygen ions in the localized area of the silicon substrate, some of the oxygen ions being absorbed by the tapered portion of the mask such that fewer oxygen ions are implanted into the silicon substrate beneath the tapered portion of the mask, wherein, upon heating treating, the resulting oxide region has a tapered shape such that the mechanical strain imposed on the surface layer of silicon over the oxide region is approximately uniform.

43. A method for forming an n-channel CMOS transistor with a strained silicon body layer, comprising:

forming shallow oxygen implants in a localized area of a silicon substrate, wherein the oxygen implants are positioned beneath a surface layer of silicon in which an active region of the transistor will be formed;

heat treating the substrate to grow an oxide region such that the surface layer of silicon is mechanically strained by oxide growth with a strain within a range between approximately 0.75% and 1.50%, the surface layer of silicon having a thickness of about 300 Å or less;

forming first and second n+ type diffusion regions in the strained surface layer of silicon, the strained surface layer of silicon between the first and second diffusion regions forming the strained silicon body layer;

forming a gate dielectric over the strained silicon body layer; and forming a gate over the gate dielectric.

44. The method of claim 43, wherein the oxide growth strains the silicon body layer with a strain within a range between approximately 1% and 1.2%.

45. The method of claim 43, wherein forming shallow oxygen implants includes implanting oxygen ions with a desired dose and a desired energy such that, upon heat treating, the oxide growth forms the oxide region with a length of approximately 3000 Å and a thickness of approximately 450 Å to provide an approximate 1.1% strain in the silicon layer.

46. The method of claim 43, wherein forming shallow oxygen implants in a localized area of a silicon substrate includes:

providing a mask on the silicon substrate to define the localized area of the silicon substrate, the mask having tapered portions proximate to the localized area; and implanting oxygen ions in the localized area of the silicon substrate, some of the oxygen ions being absorbed by the tapered portion of the mask such that fewer oxygen ions are implanted into the silicon substrate beneath the tapered portion of the mask, wherein, upon heating treating, the resulting oxide region has a tapered shape such that the mechanical strain imposed over the surface layer of silicon over the oxide region is approximately uniform.

* * * * *

UNITED STATES PATENT AND TRADEMARK OFFICE
CERTIFICATE OF CORRECTION

PATENT NO. : 7,041,575 B2 Page 1 of 2
APPLICATION NO. : 10/425797
DATED : May 9, 2006
INVENTOR(S) : Forbes It is certified that error appears in the above-identified patent and that said Letters Patent is hereby corrected as shown below:

On page 2, in Item (56), under "Other Publications", in column 1, line 8, delete "U.S.A.:" and insert - - U S A.; - -, therefor.

On page 2, in Item (56), under "Other Publications", in column 2, line 13, delete "ESSDERC'96," and insert - - ESSDERC'96. - -, therefor.

On page 2, in Item (56), under "Other Publications", in column 2, line 35, delete "Papers." and insert - - Papers, - -, therefor.

On page 2, in Item (56), under "Other Publications", in column 2, line 39, delete "995)," and insert - - 1995), - -, therefor.

On page 2, in Item (56), under "Other Publications", in column 2, line 47, delete "GexSi1-x/Si" and insert - - $Ge_xSi_{1-x}/Si$ - -, therefor.

On page 3, in Item (56), under "Other Publications", in column 1, line 41, delete "on ," and insert - - on - -, therefor.

On page 3, in Item (56), under "Other Publications", in column 1, line 47, delete "et al," and insert - - et al., - -, therefor.

On page 3, in Item (56), under "Other Publications", in column 2, line 4, delete "D, ," and insert - - D, - -, therefor.

On page 3, in Item (56), under "Other Publications", in column 2, line 26, delete "Vandebroek,," and insert - - Vandebroek, - -, therefor.

On page 3, in field (56), under "Other Publications", in column 2, line 30, delete "Complaint" and insert - - Compliant - -, therefor.

On Sheet 1 of 9, in "Drawings", in Fig. 1, delete "LATITICE" and insert - - LATTICE - -, therefor.

In column 1, lines 9-11, delete ""Output Prediction Logic Circuits With Ultra-Thin Vertical Transistors and Methods of Formation,"" and insert - - "Vertical Transistors and Output Prediction Logic Circuits Containing Same," - -, therefor.

UNITED STATES PATENT AND TRADEMARK OFFICE
CERTIFICATE OF CORRECTION

PATENT NO. : 7,041,575 B2
APPLICATION NO. : 10/425797
DATED : May 9, 2006
INVENTOR(S) : Forbes It is certified that error appears in the above-identified patent and that said Letters Patent is hereby corrected as shown below:

In column 1, lines 16-17, delete ""Strained Silicon By wafer Bonding With Misorientation,"" and insert - - "Strained Semiconductor By Wafer Bonding With Misorientation," - -, therefor.

In column 1, lines 18-19, delete ""Micromechanical Strained Silicon By Wafer Bonding,"" and insert - - "Micromechanical Strained Semiconductor By Wafer Bonding," - -, therefor.

In column 2, line 64, delete "$Si_{1-x}$-$Ge_x$" and insert - - $Si_{1-x}Ge_x$ - -, therefor.

In column 4, line 12, delete "$Si_{1-x}$-$Ge_x$" and insert - - $Si_{1-x}Ge_x$ - -, therefor.

In column 5, line 44, after "layer" insert - - , - -.

In column 14, line 58, in Claim 42, delete "heating" and insert - - heat - -, therefor.

In column 16, line 15, in Claim 46, delete "heating" and insert - - heat - -, therefor.

Signed and Sealed this

Twenty-second Day of August, 2006

JON W. DUDAS
*Director of the United States Patent and Trademark Office*